United States Patent
Liang et al.

(10) Patent No.: US 6,525,939 B2
(45) Date of Patent: Feb. 25, 2003

(54) HEAT SINK APPARATUS

(75) Inventors: Chuan-Yi Liang, Pingjen (TW); Sho-Chang Sun, Taipei (TW)

(73) Assignee: Acer Inc., Taiwan (TW)

( * ) Notice: Subject to any disclaimer, the term of this patent is extended or adjusted under 35 U.S.C. 154(b) by 0 days.

(21) Appl. No.: 09/797,938

(22) Filed: Mar. 5, 2001

(65) Prior Publication Data

US 2002/0018336 A1 Feb. 14, 2002

(30) Foreign Application Priority Data

Aug. 8, 2000 (TW) ...................... 89213875 U

(51) Int. Cl.$^7$ ................................. H05K 7/20
(52) U.S. Cl. .................. 361/697; 361/704; 361/695; 257/719; 165/121
(58) Field of Search ................ 361/678, 687, 361/688, 692, 695, 697, 702–711, 714–719, 723–727; 165/80.2, 80.3, 80.4, 185, 121–124; 174/16.3; 257/706–727; 415/211.2; 454/184

(56) References Cited

U.S. PATENT DOCUMENTS

| | | | | |
|---|---|---|---|---|
| 4,695,924 A | * | 9/1987 | Wozniczka | 361/386 |
| 5,597,034 A | * | 1/1997 | Barker et al. | 165/80.3 |
| 5,661,638 A | * | 8/1997 | Mira | 361/697 |
| 5,795,685 A | * | 8/1998 | Dean | 165/121 |
| 5,943,209 A | * | 8/1999 | Liu | 361/695 |
| 6,196,300 B1 | * | 3/2001 | Checceehetti | 165/80.3 |
| 6,330,908 B1 | * | 12/2001 | Lee et al. | 165/80.3 |
| 6,360,816 B1 | * | 3/2002 | Wagner | 165/122 |

* cited by examiner

Primary Examiner—Darren Schuberg
Assistant Examiner—Michael Datskovsky
(74) Attorney, Agent, or Firm—Michael D. Bednarek; Shaw Pittman LLP

(57) ABSTRACT

A heat sink apparatus for heat dissipation for a CPU includes a fan, a heat sink module and a latch. The fan has at least one attachment hole. The heat sink module is mounted onto the CPU, and is itself a metal heat conduction column having, a plurality of arc-shaped cooling fins radiating from the edge of the metal heat conduction column and a plurality of mounting holes positioned at the ends of the arc-shaped cooling fins. In addition, each mounting hole corresponds to a respective attachment hole. The latch comprises at least a latch arm, a plurality of openings and at least one latch hole. The latch arm is secured to the flange at the side of the CPU socket. Each of the openings corresponds to a mounting hole on the arc-shaped cooling fins of the heat sink module and the attachment holes on the fan.

14 Claims, 6 Drawing Sheets

HEAT SINK APPARATUS

REFERENCE TO RELATED APPLICATIONS

The present application claims priority to Taiwan application NO. 089213875 entitled "Heat sink apparatus" filed on Aug. 8, 2000.

BACKGROUND OF THE INVENTION

1. Field of the Invention

The present invention relates to a heat sink apparatus. More particularly, the present invention relates to a heat sink apparatus used for the heat dissipation of computer chips.

2. Description of the Related Art

Among the prior art relating to heat sinks, a computer CPU (Central Process Unit) is usually installed together with an extrusion heat sink apparatus or a die-casting heat sink apparatus for heat dissipation. Referring to FIG. 1, the figure illustrates a perspective view of a square extrusion heat sink apparatus 01, comprising a fan 10, a square extrusion heat sink module 20 and a latch 30. In the figure, the base 21 of the square extrusion heat sink module 20 is directly in contact with the heat generating part 71 of the CPU 70. As a result, heat is dissipated immediately to the cooling fins 22. As the fan 10 generates airflow, it guides the airflow to the cooling fins 22 for heat dissipation. In the square extrusion heat sink module 20, the cooling fins 22 extend vertically from the base 21, except for the space across the middle reserved for fixing the latch 30. Together the individual cooling fins 22 form a square on the base 21. The square extrusion heat sink module 20 is mounted on the CPU socket 73 at the flange 72 positioned at both sides of the socket with the latch 30. By coupling the attachment holes 11 on fan 10 and the mounting holes 23 on the square extrusion heat sink module 20, the fan 10 and the square extrusion heat sink module 20 are connected.

FIG. 2 illustrates a perspective view of a die-casting heat sink module 40. The die-casting heat sink module 40 is often applied to notebook computers. The die-casting heat sink module 40 is a single-piece module die-cast. As shown in the figure, the attachment holes 11 on the fan 10 are secured to the mounting holes 41 on the heat sink module 40, and the latch 50 is used to secure the entire heat sink module 40.

Referring back to FIG. 1, the heat sink module 20 (FIG. 1) comprises a base 21, wherein one side is the surface from which the cooling fins 22 extend and the other side is in direct contact with the CPU 70. In this way the heat generated by the CPU 70 is dissipated evenly to the cooling fins 22. The fan 10 generates airflow towards the cooling fins 22 that dissipates heat. With the development of chipset technology, the size of chips is minimized. However, limited by factors such as standards of chipset pins and CPU sockets, current CPU size cannot be further reduced. The heat generated by a CPU comes primarily from the CPU chips not the entire CPU. The currently used heat sink module 20 is in contact with the full surface area of the CPU 70, instead of concentrating on the area where central CPU chips are positioned. As a consequence, it is unable to evenly dissipate heat from the chips of the CPU 70 and from the base 21 of the heat sink module 20 to the cooling fins 22, which results in unsatisfactory heat dissipation. In accordance with the prior art, the cooling fins 22 and the base 21 of the square heat sink module 20 often divert airflow against the fan 10, which also results in unsatisfactory heat convection. The invention provides a heat sink module that reduces the mentioned diverted airflow and accordingly serves to enhance heat dissipation capacity.

SUMMARY OF THE INVENTION

According to the concept mentioned above, the prior art heat sink module fails to offer an effective solution to the problem of uneven dissipation of heat from a CPU to the cooling fins. The heat sink apparatus disclosed in the invention provides a metal heat conduction column for heat conduction. The metal heat conduction column is a cylinder. The base of the cylinder covers exactly said heat generating part 71 of the CPU 70, not its entire surface area. As a consequence, the heat from the CPU 70 can be evenly dissipated through the metal cylinder. Furthermore, a plurality of cooling fins extend from the metal column and the cooling fins radiate from the cylinder, which enables it to dissipate heat generated by CPU 70 evenly to the cooling fins and facilitate heat dissipation efficiency.

According to the above-mentioned prior art, the prior art cooling fins 22 and the base 21 of the square heat sink module 20 often divert airflow that affects the performance of the fan 10. The invention further provides arc-shaped cooling fins radiating from the central metal cylinder. The current CPU 70 applies surface mount technology, SMT, in the heat generating part 71, which slightly protrude from the surface of CPU 70. In response to this design, the metal heat conduction column disclosed in the invention is in direct contact with the CPU 70, and arc-shaped cooling fins radiate from the edge of the metal heat conduction column. According to the principles of air dynamics, under said structure, the heat sink apparatus in accordance with the invention allows the airflow generated by the fan to circulate along the arc-shaped cooling fins. Furthermore, the gap between the lower edge of the arc-shaped cooling fins and the CPU surface improves the convection of the airflow.

Another purpose of the invention is to enhance the heat dissipation efficiency of the metal heat conduction column. One option of the invention regarding the metal heat conduction column is to replace the metal material with other more conductive metals such as copper, to improve conduction efficiency between the metal conduction column and CPU 70 and thereby facilitate the dissipation efficiency.

The invention provides a latch to mount the metal heat conduction column onto the CPU. The latch comprises a latch arm, a plurality of openings and at least one latch hole, in which said latch arm is secured to the socket of the CPU. Each of said openings correspond to the mounting holes of the heat sink module 64 and attachment holes of the fan 10. The latch arm is secured to the flange 72 at side of the CPU socket 73 as shown in FIG. 1. The fan 10 and the heat sink module 64 are thereby mounted onto the CPU with the latch and act as the heat sink apparatus disclosed in the invention.

BRIEF DESCRIPTION OF THE DRAWINGS

The following detailed description, which is given by way of example and not intended to limit the invention to the embodiments described herein, can best be understood in conjunction with the accompanying drawings, in which.

DETAILED DESCRIPTION OF THE INVENTION

Figure 3:
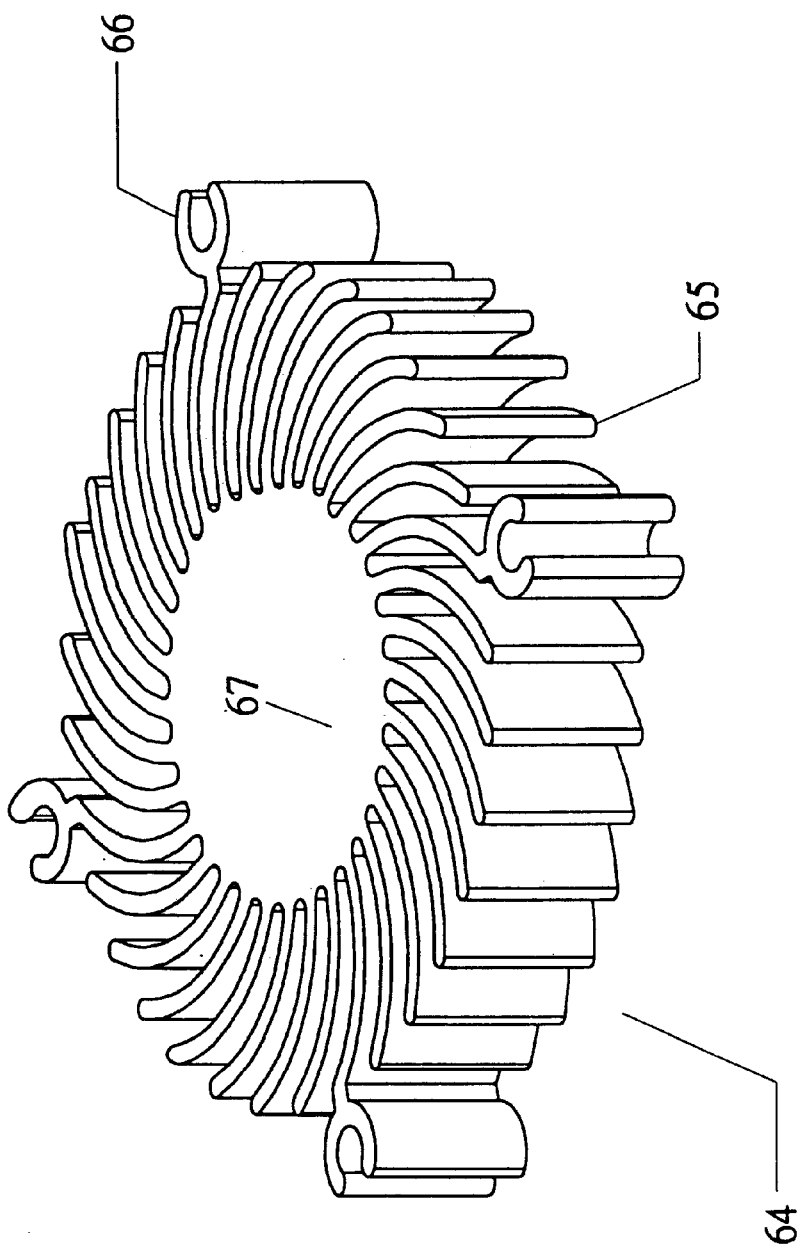
FIG. 3 illustrates a perspective view of a heat sink apparatus according to the invention.

FIG. 3 illustrates a perspective view of the invention, heat sink module 64, wherein the heat sink module 64 comprises a metal heat conduction column 67, a plurality of arc-shaped cooling fins radiating from the edge of the metal heat conduction column 67, and a plurality of mounting holes 66 positioned at the ends of the cooling fins 65. The heat sink module 64 can be manufactured as a single-piece module by either extruding or die-casting. The metal heat conduction column 67 shown in FIG. 3 is a cylinder, with a base area slightly larger than the area of the heat generating part 71 on CPU 70 and equivalent to the area of axle center 12 of the fan 10. The base of metal heat conduction column 67 is in direct contact with the heat generating part 71 of the CPU 70. In addition, a plurality of arc-shaped cooling fins radiate from the edge of the metal heat conduction column 67. Due to the fact that the cross sectional area of the metal heat conduction column 67 exactly equals the cross sectional area of the central axle 12 of the fan 10, it enables the airflow generated by the fan 10 to pass the heat sink module 64 unhindered and thereby optimizes ventilation. As shown in FIG. 3, at the end of a plurality of arc-shaped cooling fins 65 there are mounting holes 66 designed to secure the fan 10. The metal is in direct contact with the heat generating part 71 on the CPU 70. In order to achieve better heat conduction, the metal heat conduction column 67 can be hollowed out and filled with other metals giving better conductibility, such as copper. Owing to the shape of heat sink module 64, the metal heat conduction column 67 and the arc-shaped cooling fins, are similar to the shape of the fan 10. This enables the airflow generated by the fan 10 to pass the arc-shaped cooling fins 65 unhindered.

Figure 3A:
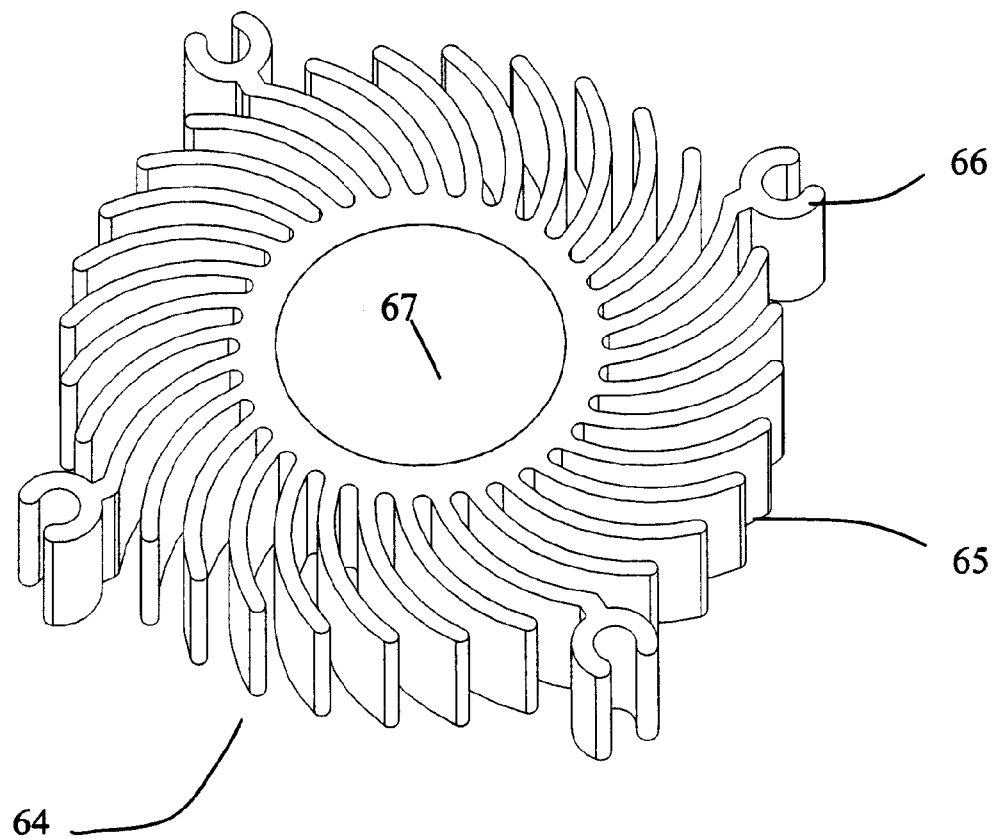
FIG. 3A illustrates a heat sink apparatus with a hollow column filled with a second metal according to the invention.

FIG. 3A illustrates a heat sink apparatus with a hollow column filled with a second metal according to the invention.

Figure 4:
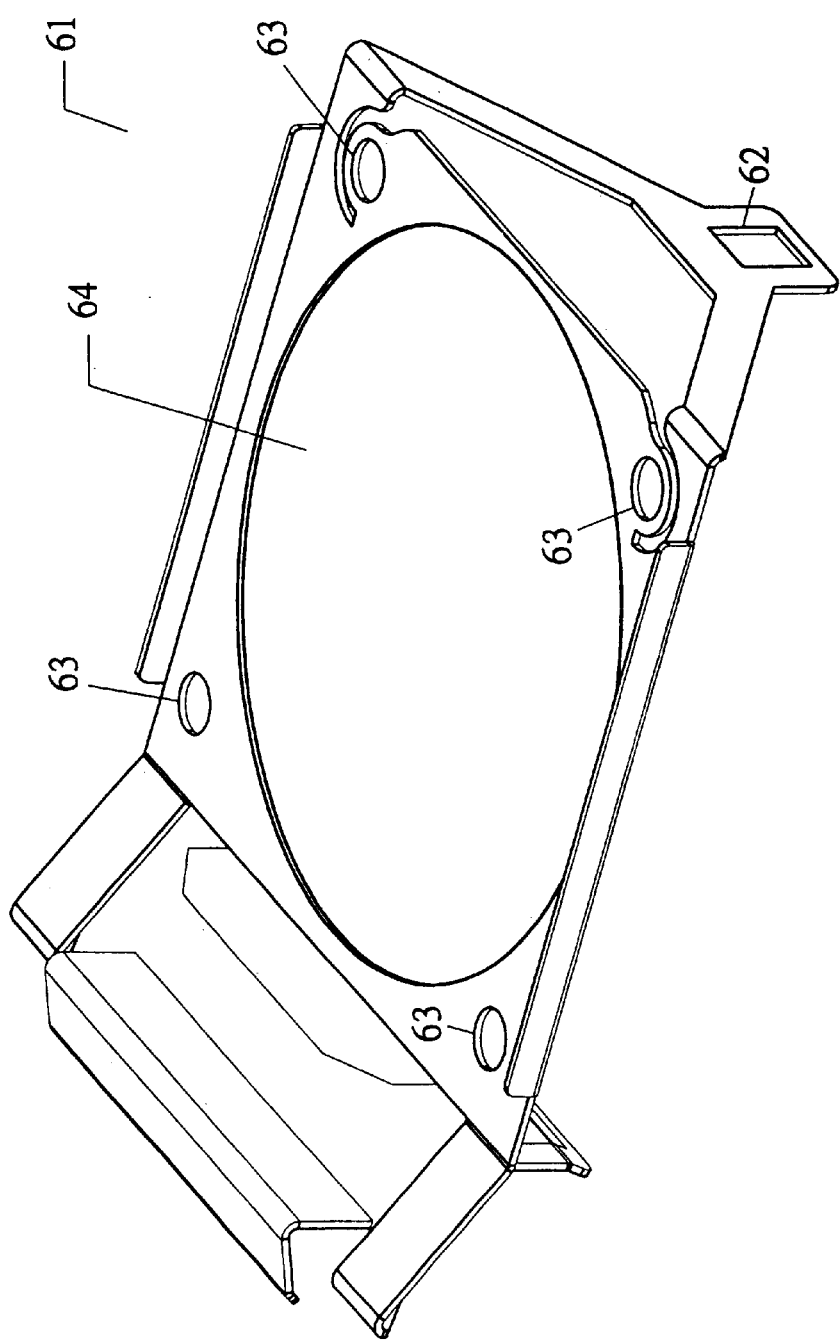
FIG. 4 illustrates a perspective view of a lock member according to the invention.

FIG. 4 illustrates a perspective view of latch 61 in accordance with the invention, wherein latch 61 can be formed by a metal sheet stamp. The latch 61 has a reversed U shape; it comprises a first surface and a second surface that is perpendicular to the first surface. There is a plurality of openings 63 designed to secure the fan 10 and the heat sink module 64, and an aperture corresponding to the size of the fan 10 designed for ventilation, on the first surface. The second surface comprises a latch arm 62 designed to secure flange 72 at both sides of the socket 73 of the CPU 70, whereby the fan 10 and the heat sink module 64 are mounted onto.

Figure 5:
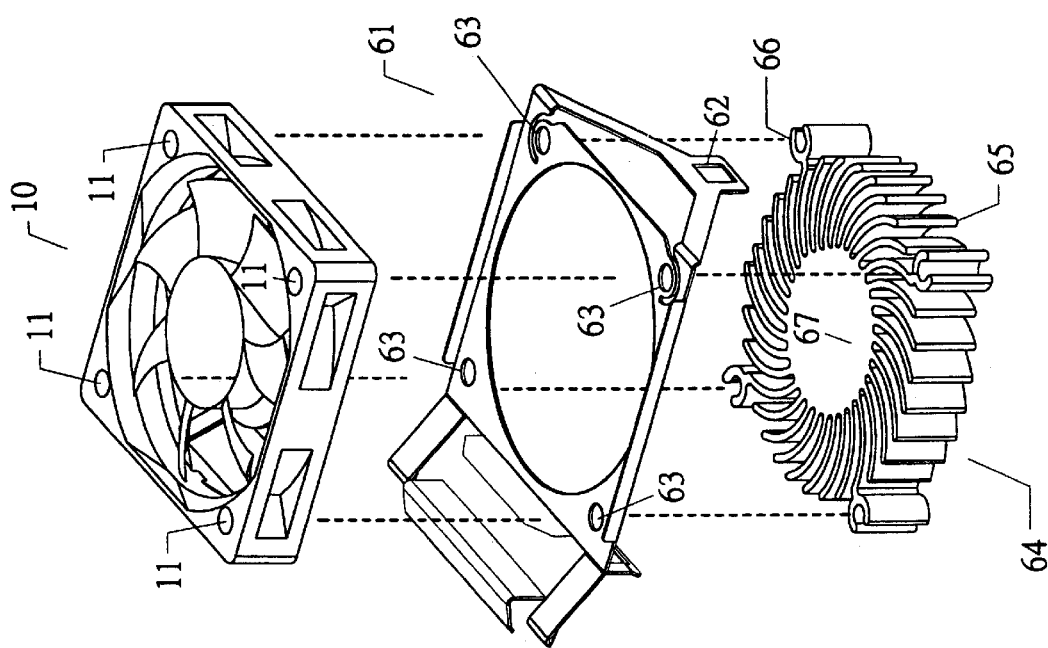
FIG. 5 illustrates a combinational view of a heat sink apparatus according to the invention.

FIG. 5 illustrates a combinational view of a preferred embodiment in accordance with the invention. The preferred embodiment comprises the fan 10, the latch 61 and the heat sink module 64. The fan 10,.the latch 61 and the heat sink module 64 can be combined by screws (not shown) through the attachment holes 11, openings 63 and mounting holes 66. The combination order is the fan 10 followed by the latch 61 and the heat sink module 64 on the bottom. An alternative order of the combination is the latch 61 first, the fan 10 in the middle and the heat sink module 64 at the bottom. Neither of the combinations has any effect upon heat dissipation efficiency of the invention, the heat sink modular 60. The heat sink module 64 dissipates heat by circulating airflow generated by the fan 10 along with the cooling fins 65. Metal heat conduction column 67 is in direct contact with heat generating part 71 of the CPU 70 and thereby conducts the heat to the arc-shaped cooling fins 65; while the airflow generated by fan 10 continues exchanging heat with the arc-shaped cooling fins 65. In the heat-exchange process, the arc-shaped cooling fins 65 radiating from the metal heat conduction column 67 work to benefit the heat-exchange process in accordance with air dynamic principles. Surface mount technology (SMT) currently used in the manufacture of CPU 70, means that the CPU heat generating part 71 slightly protrudes from the surface of the CPU 70. Therefore, when the metal heat conduction column 67 is mounted on the heat generating part 71 of the CPU 70, there is in fact a gap between the arc-shaped cooling fins 65 and the CPU socket 73, which allows the airflow generated by the fan 10 to circulate. This solves the problem of airflow circulation being hindered by the base 21 of the square extrusion heat sink module 20 as shown in FIG. 1, and which occurred in the prior art.

Figure 1:
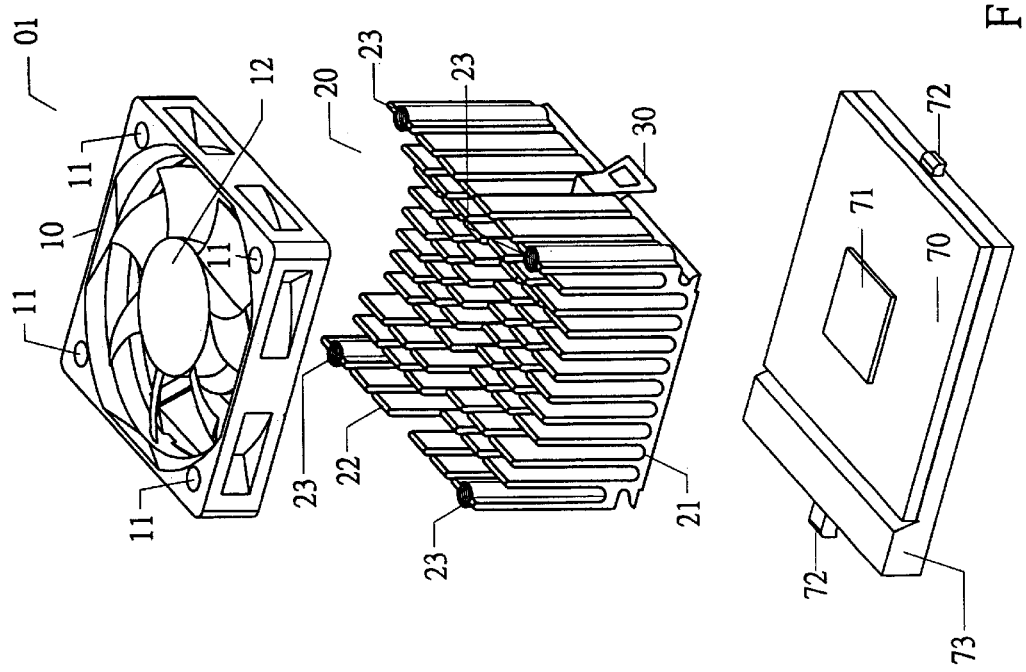
FIG. 1 illustrates a perspective view of an extrusion heat sink apparatus in accordance with the prior art.
Figure 2:
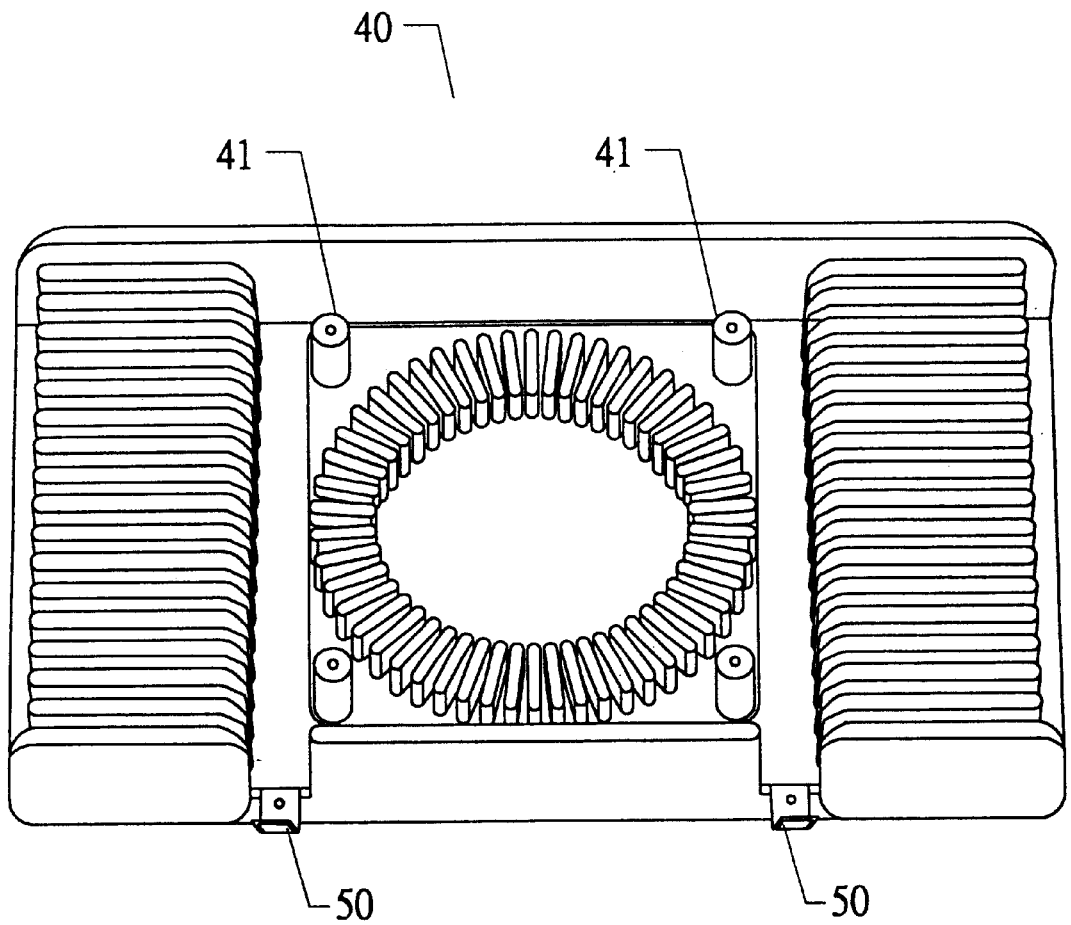
FIG. 2 illustrates a perspective view of a die-casting heat sink apparatus in accordance with the prior art.

In a comparison test between said invention and said prior art heat sink, the heat dissipation capacity of the prior art square extrusion heat sink module 20, as shown in FIG. 1, which is 3 cm high, delivers the same effect as heat sink module 64 in accordance with the invention, which is 1 cm high. The result indicates that the invention is ideal for heat dissipation for the CPU in a low profile computer system.

While the invention has been described with reference to various illustrative embodiments, the description should not be construed in a limiting sense. Various modifications of the illustrative embodiments, as well as other embodiments of the invention, will be apparent to those people skilled in the art upon reference to this description. It is therefore contemplated that the appended claims will cover any such modifications or embodiments as may fall within the scope of the invention defined by the following claims and their equivalents.

What is claimed is:

1. A heat sink apparatus, which is installed onto a CPU socket and used for heat dissipation for a CPU, comprising:
   a fan comprising at least one attachment hole;
   a heat sink module mounted on said CPU, comprising a metal heat conduction column, a plurality of arc-shaped cooling fins radiating from the edge of said metal heat conduction column and a plurality of mounting holes positioned at the ends of the arc-shaped cooling fins, corresponding to said attachment holes; and
   a latch comprising a latch arm, a plurality of openings and at least one latch hole, wherein said latch arm is secured to the socket of said CPU, wherein each of said openings correspond to said mounting holes and said attachment holes.

2. The heat sink apparatus according to claim 1, wherein said latch is directly fastened to said heat sink module and said fan is secured to said latch.

3. The heat sink apparatus according to claim 1, wherein said fan is directly fastened to said heat sink module and said latch is secured to said fan.

4. The heat sink apparatus according to claim 1, wherein each arc-shaped cooling fins is an arc-shaped rectangle radiating from said metal heat conduction column.

5. The heat sink apparatus according to claim 1, wherein said metal heat conduction column is a cylinder, the cross sectional area of said cylinder being equal to the cross sectional area of the central axle of said fan.

6. The heat sink apparatus according to claim 1, wherein said metal heat conduction column is in direct contact with said CPU and is hollowed out and filled with a metal having a heat conductibility that is better than the heat conductibility of the metal of said column.

7. The heat sink apparatus according to claim 1, wherein said heat sink module is a single-piece module.

8. A heat sink apparatus, which is used for heat dissipation for computer chips and mounted to the heat generating part of said computer chip, comprising:

a heat sink module, comprising a metal heat conduction column, a plurality of arc-shaped cooling fins radiating from the edge of said metal heat conduction column and a plurality of mounting holes positioned at the ends of the arc-shaped cooling fins, used to mount said heat sink module onto computer chips; and a latch comprising a latch arm, a plurality of openings and at least one latch hole, wherein said latch arm is secured to the socket of said computer chips, wherein each of said openings correspond to said mounting holes.

a latch comprising a latch arm, a plurality of openings and at least one latch hole, wherein said latch arm is secured to the socket of said computer chips, wherein each of said openings correspond to said mounting holes and said attachment holes.

9. The heat sink apparatus according to claim 8, wherein each of said arc-shaped cooling fins is an arc-shaped rectangle radiating from said metal heat conduction column.

10. The heat sink apparatus according to claim 8, wherein said metal heat conduction column is a cylinder, and the cross sectional area of said cylinder is approximately equal to the cross sectional area of said computer chips.

11. The heat sink apparatus according to claim 8, wherein said metal heat conduction column, in direct contact with the heat generating part of said computer chips and is hollowed out and filled with a metal having a heat conductibility that is higher than the heat conductibility of the metal of said column.

12. A heat sink module, which is used for heat dissipation for computer chips, comprising:

a metal heat conduction column, said metal heat conduction column being hollowed out and filled with a metal having a heat conductibility that is higher than the heat conductibility of the metal of said column; and a plurality of arc-shaped cooling fins, which form an arc-shaped rectangle and radiate from said metal heat conduction column.

13. The heat sink apparatus according to claim 12, wherein said heat sink module is a single-piece module.

14. The heat sink apparatus according to claim 12, wherein mounting holes are formed at the ends of said arc-shaped cooling fins.

* * * * *